(12) United States Patent
Escamilla

(10) Patent No.: US 7,849,229 B2
(45) Date of Patent: Dec. 7, 2010

(54) SPI ADDRESSING BEYOND 24-BITS

(75) Inventor: James Douglas Escamilla, Gilroy, CA (US)

(73) Assignee: Spansion LLC, Sunnyvale, CA (US)

( * ) Notice: Subject to any disclaimer, the term of this patent is extended or adjusted under 35 U.S.C. 154(b) by 189 days.

(21) Appl. No.: 12/277,911

(22) Filed: Nov. 25, 2008

(65) Prior Publication Data

US 2010/0131676 A1    May 27, 2010

(51) Int. Cl.
*G06F 3/00* (2006.01)
(52) U.S. Cl. .................................... 710/3; 710/4; 710/5
(58) Field of Classification Search ............... 710/3, 710/4, 5
See application file for complete search history.

(56) References Cited

U.S. PATENT DOCUMENTS 7,281,082 B1 * 10/2007 Knapp ..................... 711/103
2008/0091848 A1 * 4/2008 Kuo et al. ..................... 710/6
2008/0114960 A1 * 5/2008 Huang et al. .............. 711/167

* cited by examiner

*Primary Examiner*—Alford W Kindred
*Assistant Examiner*—David E Martinez
(74) *Attorney, Agent, or Firm*—Turocy & Watson, LLP

(57) ABSTRACT

A system and/or methodology that facilitates serial peripheral interface (SPI) addressing beyond 24 bits, by portioning a conventional SPI command byte into a plurality of nibbles. A new set of commands are mapped to the first nibble, and selected from the set of unused binary values under the conventional SPI command protocol. A number of address bytes required to access the storage location for the command are mapped on a second nibble, and a user and/or system definable number of dummy bytes to be sent after the command are mapped on a third nibble.

16 Claims, 8 Drawing Sheets

SPI ADDRESSING BEYOND 24-BITS

TECHNICAL FIELD

The subject innovation relates generally to memory systems and in particular, to systems and methodologies that facilitating serial peripheral interface (SPI) addressing beyond 24 bits.

BACKGROUND

A wide variety of memory devices can be used to maintain and store data and instructions for various computers and similar systems. In particular, flash memory is a type of electronic memory media that can be rewritten and retain content without consumption of power. Flash memory technology can include NOR flash and/or NAND flash, for example. NOR flash evolved from electrically erasable read only memory (EEPROM) chip technology, in which, unlike flash, a single byte can be erased; and NAND flash evolved from DRAM technology. Flash memory devices can be less expensive and denser as compared to many other memory devices, meaning that flash memory devices can store more data per unit area.

Flash memory has become popular, at least in part, because it combines the advantages of the high density and low cost of EPROM with the electrical erasability of EEPROM. Flash memory can be used in many portable electronic products, such as cellular phones, computers, voice recorders, thumbnail drives, and the like, as well as in many larger electronic systems, such as automobiles, airplanes, industrial control systems, etc. The fact that flash memory can be rewritten as well as its retention of data without a power source, small size and light weight have all combined to make flash memory devices a useful and popular means for transporting and maintaining data.

The storage capacity of flash memory has consistently increased, and the geometry or physical packaging has continually decreased. As the storage capacity of flash memory increases, a greater number of bytes are required to access the full range of addresses. In addition, as the physical size of the memory decreases, the time necessary to access a given storage location has increased. However, conventional serial peripheral interface techniques do not provide for increased addressing capability, or compensate for the time required to access a desired memory location.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

In one embodiment, a method of facilitating serial peripheral interface addressing is disclosed, including partitioning a command byte into a plurality of nibbles, encoding a command onto a first nibble, encoding a second nibble to contain a number of address bytes necessary to access a memory location for the command, and encoding a quantity of dummy bits to be sent after the command in a third nibble.

In yet another embodiment, a system is disclosed that facilitates serial peripheral interface addressing, including a process coupled to at least one memory that retains instructions for a command byte that includes a plurality of nibbles, a first nibble that contains a serial peripheral interface command, a second nibble that contains a value related to a number of address bytes needed to access a memory location for the serial peripheral interface command, and a third nibble that contains a number of dummy bytes to be sent after the command.

In an additional embodiment, a method of facilitating serial peripheral interface addressing is disclosed, including obtaining a command byte, analyzing a first nibble in the command byte to determine a command, analyzing a second nibble in the command byte to determine a number of address bytes required to access a storage location for execution of the command, and analyzing a third nibble in the command to determine a number of dummy bytes to be sent after the command.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
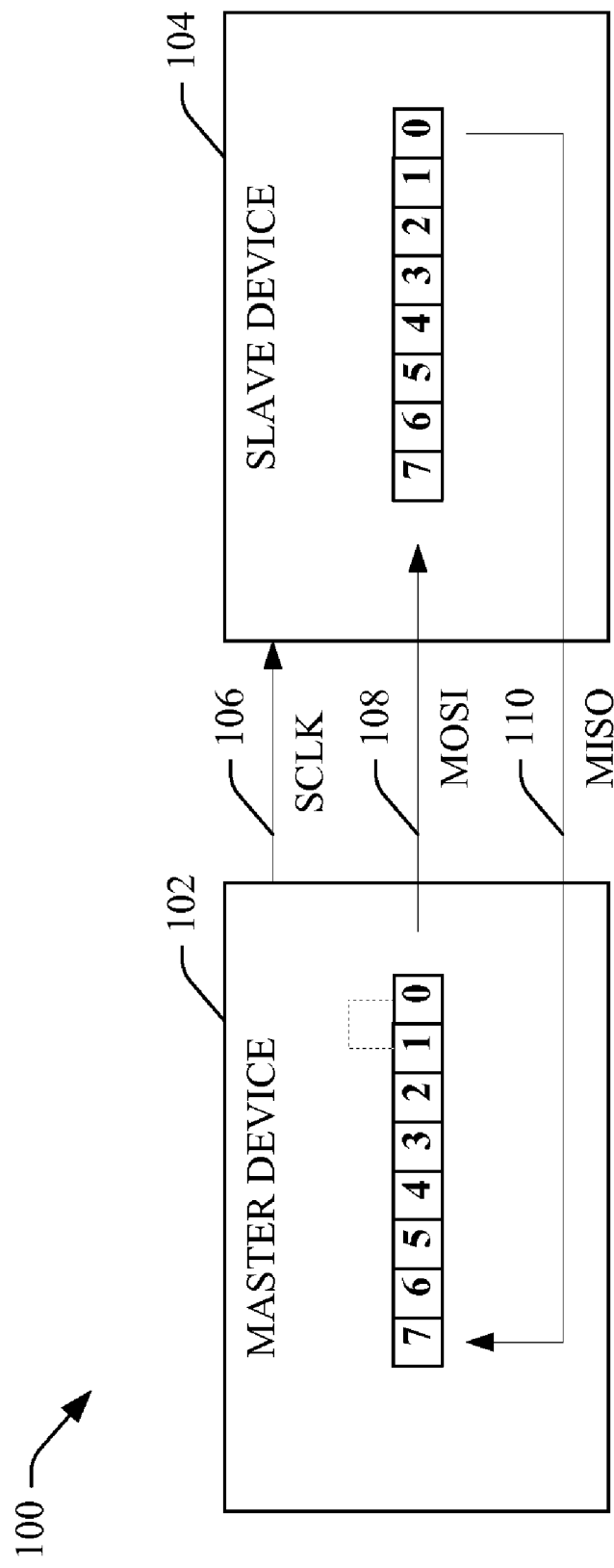
FIG. 1 illustrates an example serial peripheral interface communication system in accordance with an aspect of the subject specification.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

FIG. 1 illustrates an example communication system 100 employing a serial peripheral interface (SPI) in accordance with an aspect of the subject innovation. The communication system 100 includes a master device 102 (e.g., primary device), wherein the master device 102 can include most any electronic device, such as a computer, mobile device, and so forth. In addition the communication system 100 includes a slave device 104 (e.g., secondary) that can include, but is not limited to a memory device (e.g., flash drive, hard drive, etc.).

In order to establish communication, the master device 102 configures a clock (SCLK) 106 using a frequency that is supported by the slave device 104. For instance, if the slave device 104 can support a frequency as high as 70 Mega Hertz (MHz), then the master device 102 can configure the SLCK 106 to be a frequency less than or equal to 70 MHz. If a waiting period is required (e.g., analog-to-digital conversion, etc.) then the master device 102 must wait for at least that period of time before starting to issue clock cycles.

During each SPI clock cycle, a full duplex data transmission occurs. The master device 102 transmits data on the Master Output, Slave Input (MOSI) line 108, and the slave device 104 reads the transmission from the MOSI line 108. In addition, the slave device 104 transmits data on the Master Input, Slave Output (MISO) line 110. For example, the master device 102 can be a computer, and the slave device 104 can be a memory device, such as a flash drive. The master device 102 can initiate communication with the slave device 104 by configuring SCLK 106, transmitting a read request via the MOSI line 108 to the slave device 104 on a first clock cycle, and a set of address locations to be read on subsequent clock cycles. The slave device 104 can respond to the read request via the MISO line 110.

It is to be appreciated that while the communication system 100 is shown including only a single master device 102 and a single slave device 104, a plurality of configurations are possible within the scope and spirit of the subject innovation. The configuration is shown as illustrated for brevity and simplicity of explanation. In addition, the master device 102 and slave device 104 do not necessarily have to be separate devices, and can be part of an integrated circuit (IC) package, board layout, and so forth.

Figure 2:
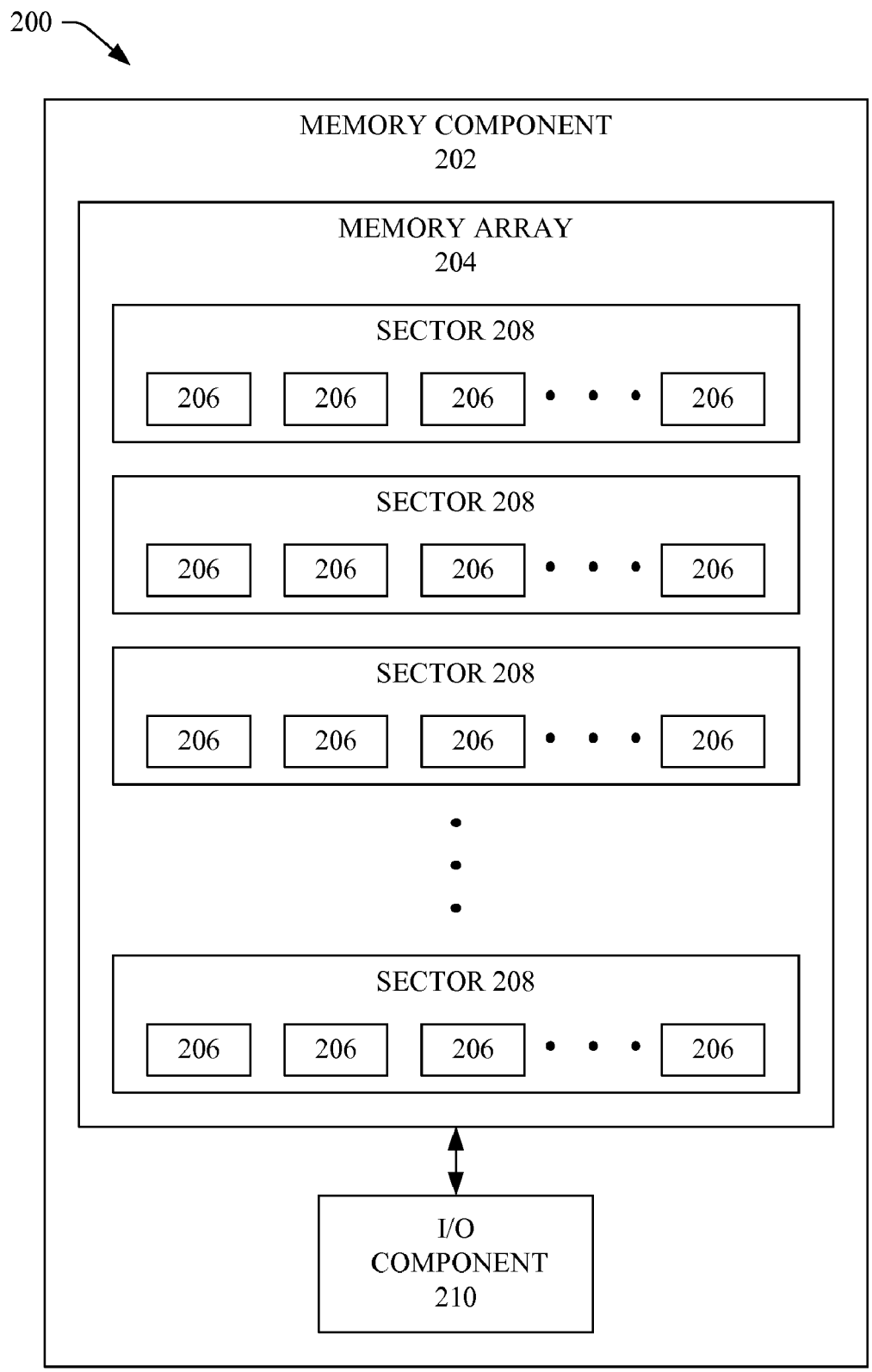
FIG. 2 illustrates an example general component block diagram of a system that can facilitate increased SPI addressing in accordance with an aspect of the subject specification.

FIG. 2 illustrates a system 200 that facilitates increased SPI addressing for a memory component 202 in accordance with an aspect of the subject innovation. System 200 can include the memory component 202 that can be comprised of one or more memory arrays 204 that can store data, operation code, commands, and so forth, in individual memory cells 206 within sectors 208 in the memory array 204. For instance, in a memory array 204, there can be P sectors that can each comprise R memory cells 206, where P and R can be respective integer numbers. Each memory cell 206 can store one or more bits of data (e.g., multi-bit memory cell). In an aspect, a memory array 204 can comprise a plurality of pages of data, wherein each page of data can comprise data stored in one or more memory cells 206 associated with the particular page of data. In yet another aspect, the memory component 202 can comprise non-volatile memory (e.g., flash memory) and/or volatile memory (e.g., static random access memory (SRAM)), where the memory array(s) 204 can be non-volatile memory. It is to be appreciated and understood that, while one memory component 202 is depicted in system 200, the subject innovation is not so limited, as system 200 can include a plurality of memory components 202. Only one memory component 202 is depicted herein for brevity and clarity.

The memory component 202 can also include an I/O component 210 that can be associated with the memory array 204, and can facilitate accessing (e.g., read, write, erase, etc.) one or more storage locations (e.g., one or more storage location(s) contained in a memory cell 206). For example, the memory component 202 can be configured as a slave device (discussed supra), and the I/O component 210 can receive, acquire, or otherwise obtain one or more commands (e.g., such as an erase command), and address locations from a master device. The I/O component 210 can implement the command for the one or more storage locations contained in one or more memory cells 206.

Figure 3:
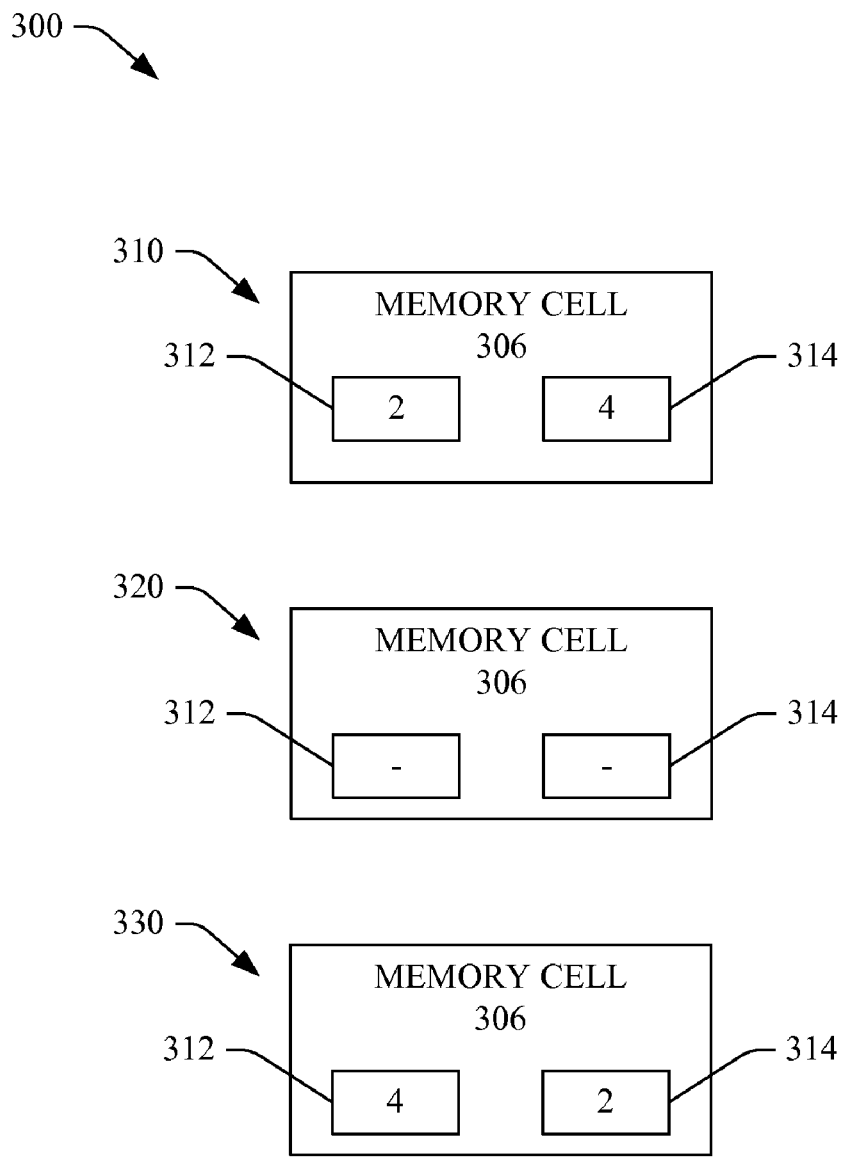
FIG. 3 illustrates an example diagram illustrative of a data storage in accordance with an aspect of the subject specification.

Referring briefly to FIG. 3, illustrated is an example diagram of a data storage and addressing flow 300 in accordance with an aspect of the subject innovation. In one aspect, as depicted at 310, a memory cell 306, associated with a page of data in a memory array 304 of the memory component 202, can have two storage locations 312, 314 that each can have respective data states (e.g., four levels representing four different data states). In this example, the first storage location 312 can be programmed to 2 (e.g., first program level represented at 01 in binary form) and the second storage location 314 can be programmed to 4 (e.g., third program level represented as 10 in binary form) respectively.

It may be desirable to access read the program level programmed in a particular memory cell 306. For instance, the data stored in the storage locations 312 and 314 can in combination with data stored in other locations comprise a file to be a read by a master device. Furthermore, it may be desirable to erase the data stored in the storage locations 312 and 314. In which case, the data stored in the storage locations 312 and 314 can be removed, as illustrated at 320. Moreover, data can be written over the storage locations 312 and 314, as illustrated in 330. In this example, the previous data stored in 312 can be reprogrammed to 4 and the second storage location 314 can be reprogrammed to 2, respectively.

Referring again to FIG. 2 and the memory component 202, the nonvolatile memory can include, but is not limited to, flash memory (e.g., single-bit flash memory, multi-bit flash memory), read-only memory (ROM), mask-programmed ROM, programmable ROM (PROM), Erasable PROM (EPROM), Ultra Violet (UV)-erase EPROM, one-time programmable ROM, electrically erasable PROM (EEPROM), and/or nonvolatile RAM (e.g., ferroelectric RAM (FeRAM)). A flash memory can be comprised of NAND memory and/or NOR memory, for example. Volatile memory can include, but is not limited to, random access memory (RAM), SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Ram bus dynamic RAM (RDRAM).

Figure 4:
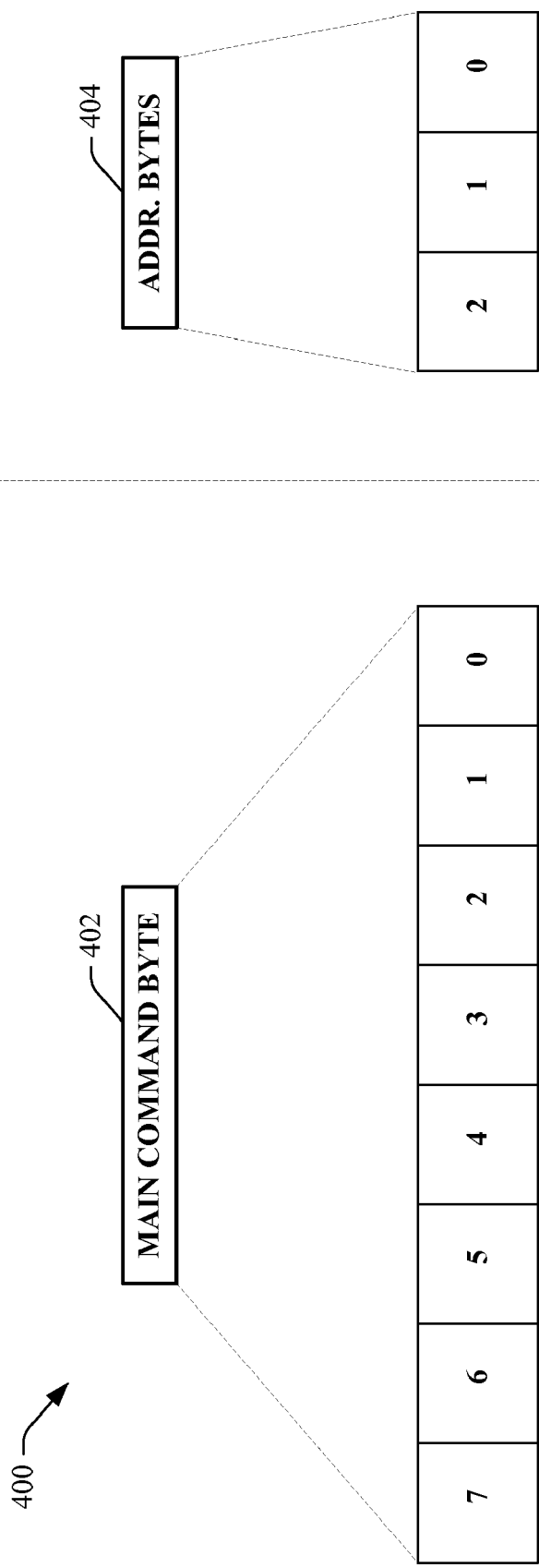
FIG. 4 illustrates an example conventional SPI addressing protocol in accordance with an aspect of the subject specification.

Turning to FIG. 4, an example conventional SPI addressing structure is shown in accordance with an aspect of the subject innovation. The structure 400 includes a main command byte 402, and a set of three address bytes 404. The command byte (e.g., eight command bits 0-7) can define, indicate, or otherwise set forth a command for a memory device (discussed supra). For instance, the command byte 402 can contain commands, including but not limited to read, write, erase, fast read, program, and so forth.

A memory device receiving the main command byte 402 based the command contained in the command byte 402 can determine that the set of three bytes following the main command byte 402 are address bytes 404. For instance, if the main command byte 402 contains a read command, then the device can determine that the three bytes following the main command byte 402 are address bytes. It is to be appreciated that each of the address bytes 404 contains 8 bits for a total of 24 address bits. Consequently, the addressing structure 400 is limited to 24 address bits, or addressing for approximately 16 MB. Typically, address bits outside this addressing range are disregarded.

Figure 5:
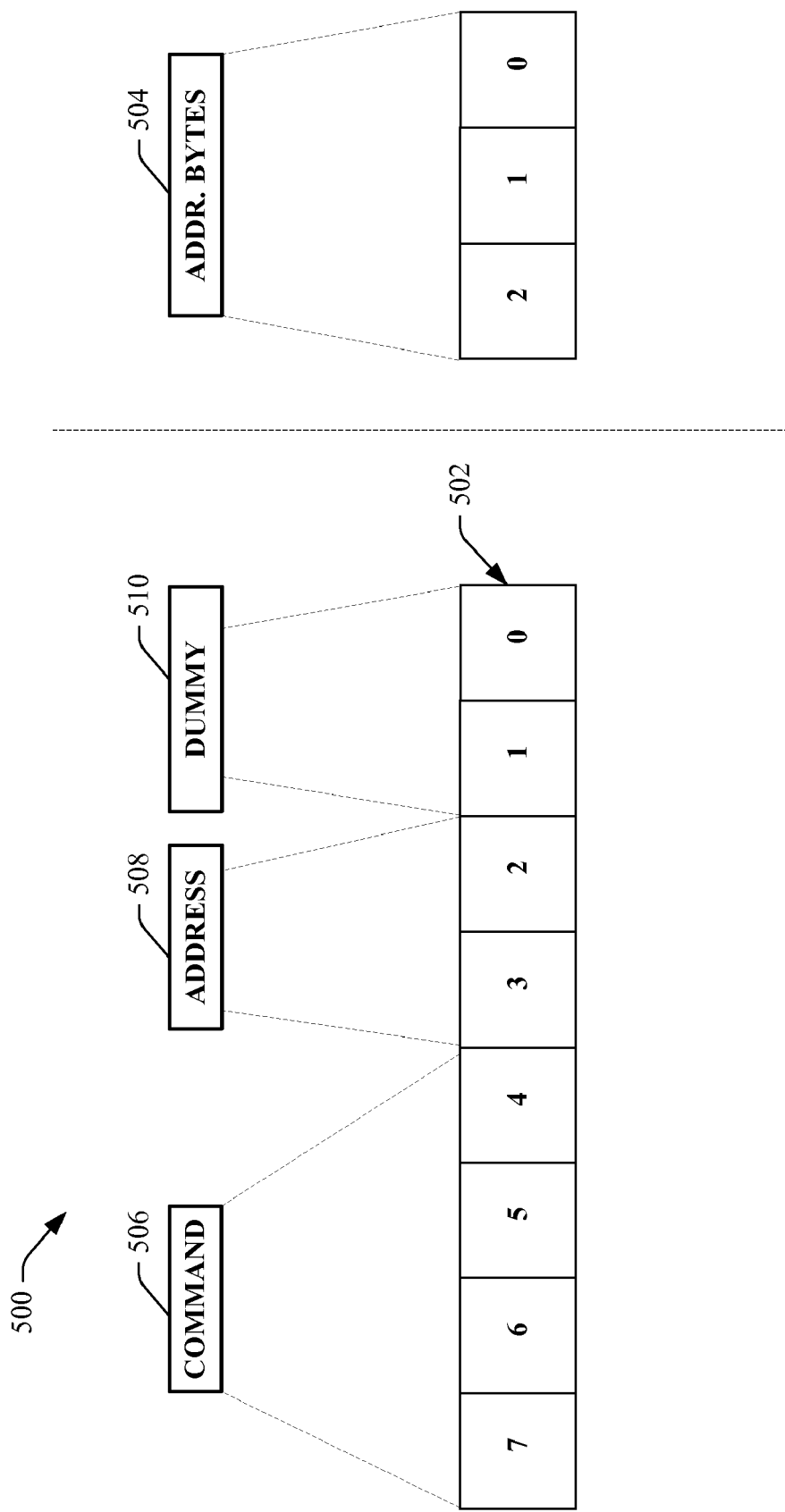
FIG. 5 illustrates an example addressing protocol facilitating increased SPI addressing in accordance with an aspect of the subject specification.

FIG. 5 illustrates an example SPI addressing protocol that facilitates addressing beyond 24 bits in accordance with an aspect of the subject innovation. The structure 500 includes a main command byte 502, and a set of address bytes 504. The main command byte 502 is partitioned, segmented, or otherwise divided into one or more nibbles 506-510. The nibbles include a set of command bits 506, a set of address bits 508, and a set of dummy bits 510. In this example, the first nibble (e.g., bits 7-4) of the main command byte 502 are mapped to the command bits 506, the following nibble (e.g., bits 3-2) is mapped to the address bits 508, and the next nibble (e.g., bits 1-0) is mapped to the dummy bits 510.

A plurality of SPI commands can be mapped to unassigned nibbles for the command bits 506. For example, multi-byte erase can be programmed as a 6 (e.g., 0110 in binary form), multi-byte read can be can programmed as a 7 (e.g., 0111 in binary form), and multi-byte write can be can programmed as a 8 (e.g., 1000 in binary form), wherein 6, 7, and 8 are unused binary states in bits 7-4 under the standard SPI protocol. It is to be appreciated that most any SPI commands can be defined using the command bits 506 in the structure 500, as illustrated in the example SPI command table (Table 1) below.

device will interpret the number of address bytes following the main command 502 based on the address bits 508.

The SPI addressing protocol 500 is backwards compatible with the conventional SPI addressing structure (as shown in FIG. 4). For instance, if a main command 502 includes address bits 508 programmed as 0 (e.g., 00 in binary form), then the structure 500 is the same as the conventional addressing structure, wherein the three (3) bytes following the main command 502 are the address bytes. In addition, as long as the command bits 506 are assigned unused command nibbles there will not be a conflict between commands in the protocol 500 and a conventional SPI addressing protocol.

After issuing a command, generally a requester will have to wait for an amount of time while the memory device actually accesses the desired data. SPI devices typically output a dummy byte when valid data will not be available immediately after a command. The number of dummy bytes is user and/or system definable via the dummy bits 510. For instance, no dummy bytes can be indicated by a 0 (e.g., 00 in binary form), one dummy byte can be indicated by a 1 (e.g., 01 in binary form), two dummy bytes can be indicated by a 2 (e.g., 10 in binary form), three dummy bytes can be indicated by a 3 (e.g., 11 in binary form). Adjusting the number of dummy bytes sent enables the system to set the needed wait states to balance tIACC and tBACC.

TABLE 1

| Operation | Command | Description | One-Byte Command Code | Address Bytes | Dummy Byte | Data Bytes |
|---|---|---|---|---|---|---|
| Read | READ | Read Data Bytes | 0Bh (0000 0011) | 3 | 0 | 1 to ? |
| | FAST_READ | Read Data Bytes at Higher Speed | 0Bh (0000 1011) | 3 | 1 | 1 to ? |
| | RDID | Read Identification | 9Fh (1001 1111) | 0 | 0 | 1 to 3 |
| | READ_ID | Read Manufacturer ID and Device ID | 90h (1001 0000) | 3 | 0 | 1 to ? |
| | MB_Read | Multi-Byte Address Read | 7xh (0111 xxyy) | 3 to 6 | 0 to 3 | 1 to ? |
| Write Control | WREN | Write Enable | 06h (0000 0110) | 0 | 0 | 0 |
| | WRDI | Write Disable | 04h (0000 0100) | 0 | 0 | 0 |
| Erase | SE | 64 KB Sector Erase | 20h (0010 0000) or D8h (1101 1000) | 3 | 0 | 0 |
| | | Multi-Byte Address Erase | 6xh (0110 xxyy) | 3 to 6 | 0 to 3 | 0 |
| | BE | Bulk (Chip) Erase, Uniform64 KB Sector Product | C7h (1100 0111) or 60h (0110 0000) | 0 | 0 | 0 |
| | | Bulk (Chip) Erase, Uniform256 KB Sector Product | C7h (1100 0111) | 0 | 0 | 0 |
| Program | PP | Page Program | 02h (0000 0010) | 3 | 0 | 1 to 256 |
| | MB_Write | Multi-Byte Address Write | 8xh (1000 xxyy) | 3 to 6 | 0 to 3 | 1 to 256 |
| Status Register | RDSR | Read from Status Register | 06h (0000 0101) | 0 | 0 | 1 to ? |
| | WRSR | Write to Status Register | 01h (0000 0001) | 0 | 0 | 1 |
| Parallel Mode | Entry | Enter x8 Parallel Mode | 55h (0101 0101) | 0 | 0 | 0 |
| | Exit | Exit x8 Parallel Mode | 45h (0100 0101) | 0 | 0 | 0 |
| Power Saving | DP | Deep Power Down | B9h (1011 1001) | 0 | 0 | 0 |
| | RES | Release from Deep Power Down | ABh (1010 1011) | 0 | 0 | 0 |
| | | Release from Deep Power Down and Read Electronic Signature | ABh (1010 1011) | 0 | 3 | 1 to ? |

The address bits 508 indicate, determine, or otherwise signal a type of address that follows the main command 506. For instance, the address bytes can be three (3) less than the number of address bytes used to access a memory location. In this example, an address in the 16 MB address range can be indicated by a 0 (e.g., 00 in binary form; indicating a 3 byte address) in the address bits 508, an address in the 4 Gigabyte address range can be indicated by a 1 (e.g., 01 in binary form; indicating a 4 byte address) in the address bits 508, an address in the 1 Terabyte address range can be indicated by a 2 (e.g., 10 in binary form; indicating a 5 byte address) in the address bits 508, or an address in the 256 Terabyte address range can be indicated by a 3 (e.g., 11 in binary form; indicating a 6 byte address) in the address bits 508. In this example, the receiving In view of the exemplary systems described supra, a methodology that may be implemented in accordance with the disclosed subject matter will be better appreciated with reference to the flow charts of FIGS. 6-7. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, the illustrated blocks do not represent all possible steps, and not all illustrated blocks may be required to implement the methodologies described hereinafter.

Figure 6:
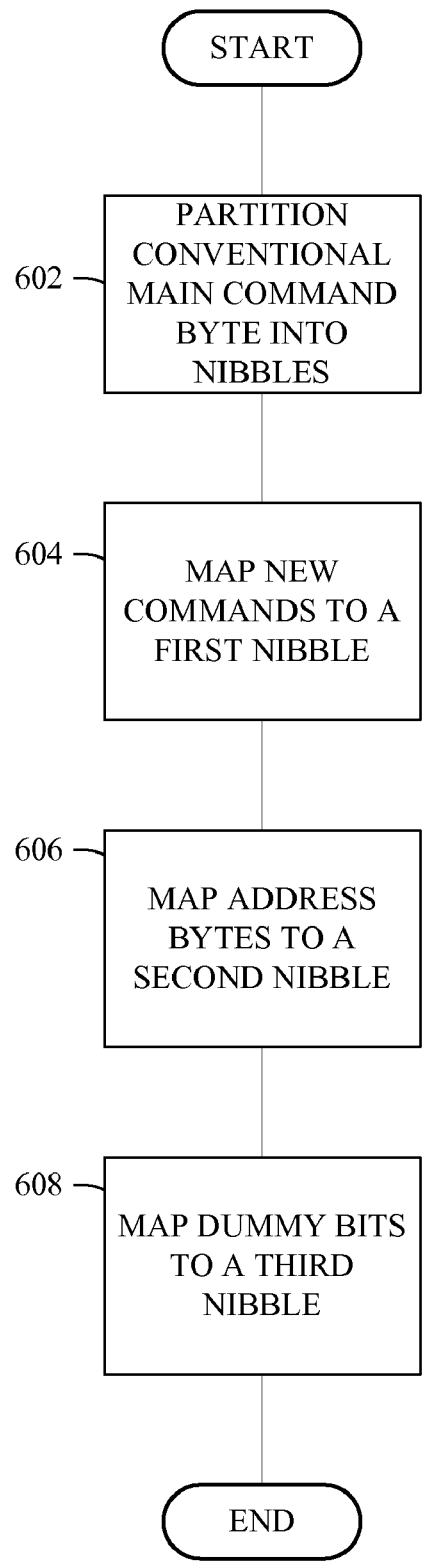
FIG. 6 illustrates an example methodology that can facilitate increased SPI addressing in accordance with an aspect of the subject specification.

Referring now to FIG. 6, an example methodology of facilitating increased SPI addressing is illustrated in accordance with an aspect of the subject innovation. At 602, a conventional main command byte is partitioned into one or more nibbles. In one example embodiment, the main command byte consist of 8 bits, and can be partitioned into a first nibble consisting of four (4) bits, a second nibble consisting of two (2) bits, and a third nibble consisting of two (2) bits (See FIG. 5). Typically, in a conventional SPI addressing protocol the SPI commands are structured such that the entire main command byte is mapped to a single command. At 604, a set of commands is mapped to the first nibble. It may be desirable to select unassigned command nibbles in order to prevent confusion or interference with alternative addressing protocols. For example, a multi-byte erase command can be mapped to 6 (e.g., 0110 in binary form), a multi-byte read command can be mapped to 7 (e.g., 0111 in binary form), and a multi-byte write command can be mapped to 8 (e.g., 1000 in binary form).

In the conventional SPI addressing protocol, a receiving device determines that the following three bytes will be address bytes based on the command. For instance, if the device receives a read command, then based on previous knowledge it determines that the three bytes following the read command are the address that is to be read. However, restricting the address to three bytes limits the addressing capabilities of the conventional SPI addressing protocol to approximately 16, 777, 216 addresses (e.g. or 16 MB of addressing). At 606, a number of address bytes used to access a memory location are mapped to the second nibble. As discussed supra, the nibble can be programmed to be three less than the number of address bytes used to access the memory location. For example, to access an address in the 16 MB address range the second nibble can contain a 0 (e.g., 00 in binary form; wherein 0 plus 3 indicates a 3 byte address), to access an address in the 4 Gigabyte address range (e.g. addresses 16, 777, 216 to 4, 294, 967, 296) the second nibble can contain a 1 (e.g., 01 in binary form; indicating a 4 byte address), to access an address in the 1 Terabyte address range (e.g. 4, 294, 967, 296 to 1, 099, 511, 627, 776 addresses) the second nibble can contain a 2 (e.g., 10 in binary form; indicating a 5 byte address, or to access an address in the 256 Terabyte address range the second nibble can contain a 3 (e.g., 11 in binary form; indicating a 6 byte address).

At 608, a set of user and/or system definable dummy bytes are mapped to the third nibble. SPI devices typically output a dummy byte when valid data will not be available immediately after a command, in order to compensate for the time it takes a device to access the desired memory location. Allowing a user or system to define or adjust the number of dummy bytes enables setting of needed wait states. As previously discussed, a 0 (e.g., 00 in binary form) in the third nibble can define the number of dummy bytes as zero, a 1 (e.g., 01 in binary form) in the third nibble can define the number of dummy bytes as one, a 2 (e.g., 10 in binary form) in the third nibble can define the number of dummy bytes as two, and a 3 (e.g., 11 in binary form) in the third nibble can define the number of dummy bytes as zero.

Figure 7:
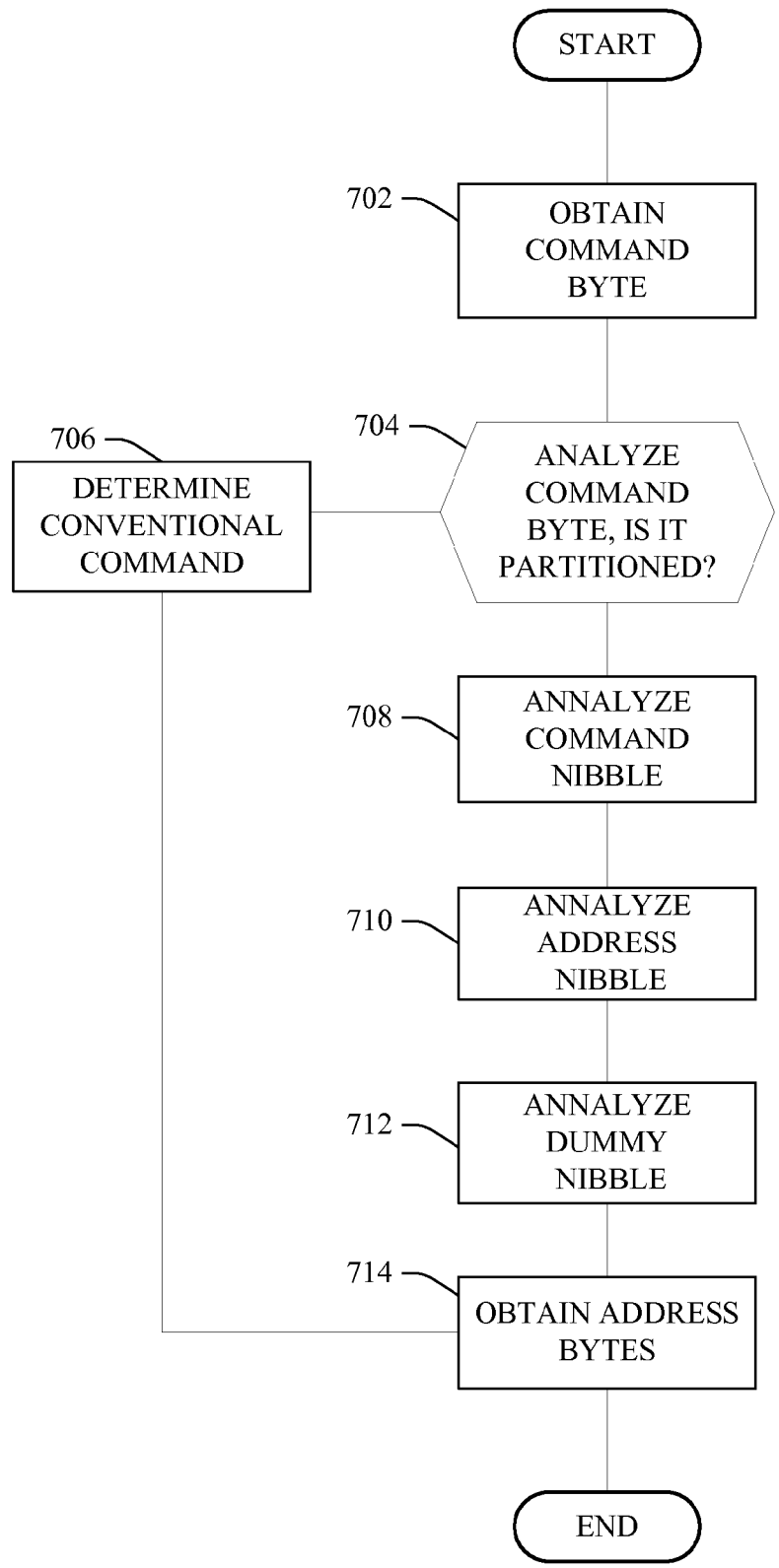
FIG. 7 illustrates an example methodology that can facilitate increased SPI addressing in accordance with an aspect of the subject specification.

Referring now to FIG. 7, an example methodology of facilitating increased SPI addressing is illustrated in accordance with an aspect of the subject innovation. At 702, a command byte is obtained. For example, the command byte can be sent to a memory device (e.g. flash memory) from a computer via typical SPI communication protocol. At 704, the command byte is analyzed to determine whether the command byte is partitioned into a plurality of nibbles. For instance, a first nibble can be analyzed to determine if it contains a command. If the first nibble does contain a command then the command byte is partitioned, if the first nibble does not contain a command then the command byte is not partitioned. At 706, if the command byte is not partitioned, then a conventional SPI command can be determined. As previously discussed, under conventional SPI addressing protocols, commands are typically mapped to the entire command byte, and the device receives the following three address bytes at 714. When there is a conventional SPI command, the device recognizes based on the command that the following three bytes are address bytes.

At 708, if the command byte is portioned, then the first nibble is analyzed to determine the SPI command (e.g., read, write, erase, etc.). At 710, a second nibble is analyzed to determine the number of address bytes that are used to access a memory location for the command. For example, if the address of the memory location is between 16 MB and 4 GB then a 4 byte address will be used to access the memory location. A third nibble is analyzed at 712, to determine the number of wait states or dummy bytes required. Typically, SPI devices output a dummy byte when valid data will not be available immediately after a command. At 714, a plurality of address bytes are obtained based on the number determined from the address nibble at 710.

Figure 8:
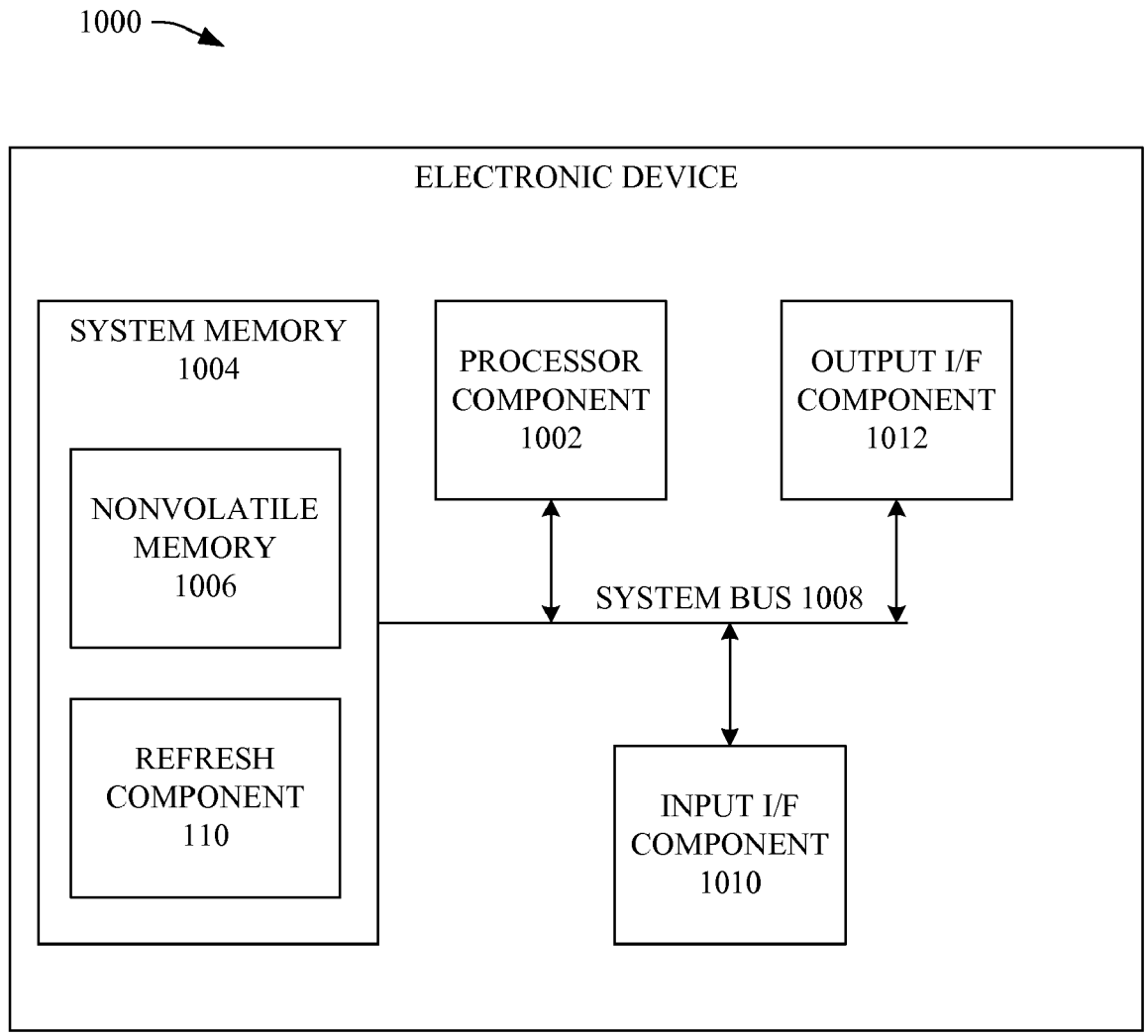
FIG. 8 is a block diagram of an exemplary, non-limiting electronic device that can employ a memory.

Referring to FIG. 8, illustrated is a block diagram of an exemplary, non-limiting electronic device 1000 that can comprise and/or incorporate system 100, memory devices 200 and 300, addressing structure/protocol 400 and/or 500, or a respective portion(s) thereof, and/or implement methodology 600, and/or methodology 700, or respective portions thereof. The electronic device 800 can include, but is not limited to, a computer, a laptop computer, network equipment (e.g., routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), a set-top box, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like.

Components of the electronic device 800 can include, but are not limited to, a processor component 802 (e.g., which can be and/or can include the same or similar functionality as processor component 502, as depicted in FIG. 5 and described herein), a system memory 804, which can contain a nonvolatile memory 806, and a system bus 808 that can couple various system components including the system memory 804 to the processor component 802. In one aspect, the system memory 804 can be and/or can comprise the same or similar functionality as respective components (e.g., memory component 202) as more fully described herein.

In another aspect, the system bus 808 can be comprised of any of several types of bus structure(s) including, but not limited to, a memory bus, memory controller, peripheral bus, external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MCA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

Electronic device 800 can typically include a variety of computer readable media. Computer readable media can be any available media that can be accessed by the electronic device 800. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 806 (e.g., flash memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 800. Communication media typically embodies computer readable instructions, data structures, program modules or other data in a modulated data signal such as a carrier wave or other transport mechanism and includes any information delivery media.

The system memory 804 can include computer storage media in the form of volatile (e.g., SRAM) and/or nonvolatile memory 806 (e.g., flash memory), where the nonvolatile memory 806 can be removable media or non-removable media. A basic input/output system (BIOS), containing the basic routines that can facilitate transferring information between elements within electronic device 800, such as during start-up, can be stored in the system memory 804. The system memory 804 typically also can contain data and/or program modules that can be accessible to and/or presently be operated on by the processor component 802. By way of example, and not limitation, the system memory 804 can also include an operating system(s), application programs, other program modules, and program data.

The nonvolatile memory 806 can be removable or non-removable. For example, the nonvolatile memory 806 can be in the form of a removable memory card or a USB flash drive. In accordance with one aspect, the nonvolatile memory 806 can include flash memory (e.g., single-bit flash memory, multi-bit flash memory), ROM, PROM, EPROM, EEPROM, or NVRAM (e.g., FeRAM), or a combination thereof, for example. Further, a flash memory can comprise NOR flash memory and/or NAND flash memory.

A user can enter commands and information into the electronic device 800 through input devices (not shown) such as a keypad, microphone, tablet, or touch screen although other input devices can also be utilized. These and other input devices can be connected to the processor component 802 through input interface component 810 that can be connected to the system bus 808. Other interface and bus structures, such as a parallel port, game port or a universal serial bus (USB) can also be utilized. A graphics subsystem (not shown) can also be connected to the system bus 808. A display device (not shown) can be also connected to the system bus 808 via an interface, such as output interface component 812, which can in turn communicate with video memory. In addition to a display, the electronic device 800 can also include other peripheral output devices such as speakers (not shown), which can be connected through output interface component 812.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

As utilized herein, terms "component," "system," "interface," and the like, can refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein can encompass a computer program accessible from any computer-readable device, carrier, or media. For example, computer readable media can include, but is not limited to, magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications can be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates serial peripheral interface addressing, comprising:
   a process coupled to at least one memory that retains instructions for:
   a command byte that includes a plurality of nibbles;
   a first nibble that contains a serial peripheral interface command;
   a second nibble that contains a value related to a number of address bytes needed to access a memory location for the serial peripheral interface command; and
   a third nibble that contains a number of dummy bytes to be sent after the command, the dummy bytes determine the number of wait states to be performed after the command.

2. The system of claim 1, the command byte is comprised of 8 bits, the first nibble is 4 bits, the second nibble is 2 bits, and the third nibble is 2 bits.

3. The system of claim 2, the serial peripheral interface command contained in the first nibble is at least one of a multi-byte read, multi-byte write, or multi-byte erase command.

4. The system of claim 3, the serial peripheral interface command for a multi-byte erase is a 6 or 0110 in binary form, multi-byte is a 7 or 0111 in binary form, and multi-byte write is a 8 or 1000 in binary form.

5. The system of claim 1, the serial peripheral interface commands in the first nibble are unassigned binary values in a standard serial peripheral interface addressing protocol, wherein the unassigned binary values do not conflict with standard serial peripheral interface protocol commands.

6. The system of claim 1, the value contained in the second nibble is three less than the number of address bytes needed to access a memory location to perform the serial peripheral interface command.

7. A method of facilitating serial peripheral interface addressing, comprising:
   partitioning a command byte into a plurality of nibbles;
   encoding a command onto a first nibble;
   encoding a second nibble to contain a number of address bytes necessary to access a memory location for the command; and
   encoding a quantity of dummy bits to be sent after the command in a third nibble; and
   mapping the commands in the first nibble to unassigned binary values in a standard serial peripheral interface addressing protocol, wherein the unassigned binary values do not conflict with standard serial peripheral interface protocol commands.

8. The method of claim 7, allocating 4 bits to the first nibble, 2 bits to the second nibble, and the 2 bits to the third nibble, wherein the command byte is comprised of 8 bits.

9. The method of claim 8, further comprising encoding the command contained in the first nibble to include at least one of a multi-byte read, multi-byte write, or multi-byte erase command.

10. The method of claim 9, further comprising setting the command for a multi-byte erase as a 6 or 0110 in binary form, for a multi-byte read as a 7 or 0111 in binary form, and for a multi-byte write as a 8 or 1000 in binary form.

11. The method of claim 7, further comprising setting the value contained in the second nibble to be three less than the number of address bytes needed to access a memory location to perform the command.

12. The method of claim 7, further comprising determining a number of wait states to be performed after the command based on the number dummy bytes.

13. A method of facilitating serial peripheral interface addressing, comprising:
   obtaining a command byte;
   analyzing a first nibble in the command byte to determine a command;
   analyzing a second nibble in the command byte to determine a number of address bytes required to access a storage location for execution of the command; and
   analyzing a third nibble in the command to determine a number of dummy bytes to be sent after the command; and
   analyzing the first 4 bits of the command byte to determine first nibble, the following 2 bits to determine the second nibble, and the following 2 bits to determine the third nibble, wherein the command byte is comprised of 8 bits.

14. The method of claim 13, further comprising determining the command is a multi-byte erase if the first nibble contains a 6 or 0110 in binary form, a multi-byte read if the first nibble contains a 7 or 0111 in binary form, or a multi-byte write if the first nibble contains an 8 or 1000 in binary form.

15. The method of claim 13, further comprising adding three to the value contained in the second nibble to determine the number of address bytes following the command byte to access a memory location for the command.

16. The method of claim 13, further comprising determining a number of wait states to be performed after the command based on the number of dummy bytes.

* * * * *